United States Patent [19]

Herbst et al.

[11] 4,334,239
[45] Jun. 8, 1982

[54] MONOLITHICALLY INTEGRATED CIRCUIT FOR LINEAR IMAGE SCANNING WITH MATCHABLE SENSORS

[75] Inventors: Heiner Herbst; Matthias Niemeyer, both of Munich, Fed. Rep. of Germany

[73] Assignee: Siemens Aktiengesellschaft, Berlin and Munich, Fed. Rep. of Germany

[21] Appl. No.: 171,717

[22] Filed: Jul. 24, 1980

[30] Foreign Application Priority Data

Sep. 28, 1979 [DE] Fed. Rep. of Germany ....... 2939403

[51] Int. Cl.³ .............................................. H04N 9/07
[52] U.S. Cl. .................................................. 358/44
[58] Field of Search ......................................... 358/44

[56] References Cited

PUBLICATIONS

"A Multiple-Gate CCD Photodiode Sensor Element for Imaging Arrays" White et al., vol. ED-25, No. 2, *IEEE Transaction on Electronic Devices*, Feb. 1978, pp. 125–131.

"Solid State Sensors" BBC Report RD 1973/32 Nov. 73, pp. 1–17.

"Charge Transfer Devices" Sequin & Tompsett Academic Press, Inc., N.Y., 1975, pp. 1–18.

*Primary Examiner*—Richard Murray
*Attorney, Agent, or Firm*—Hill, Van Santen, Steadman, Chiara & Simpson

[57] ABSTRACT

A color image scanning circuit has a linear image sensor with photodiode sensor elements disposed in two adjacent rows integrated on a semiconductor substrate. The sensor elements are divided into groups with all sensors in each group being covered with one of several different color filters. An overflow gate is provided on the substrate between the rows of sensor elements for each group of sensor elements and are provided with individually variable clock pulse voltages for selectively varying the integration time of each group of sensor elements. By selective dimensioning of the respective integration times, compensation of the varying spectral light-sensitivities of the sensor elements can be accurately and simply achieved for generating balanced output signals for each sensor element group.

6 Claims, 3 Drawing Figures

MONOLITHICALLY INTEGRATED CIRCUIT FOR LINEAR IMAGE SCANNING WITH MATCHABLE SENSORS

BACKGROUND OF THE INVENTION

The present invention relates to monolithically integrated linear image scanning circuits, and in particular to such a circuit with components for matching the varying spectral sensitivities of differently filtered sensor elements.

A monolithically integrated circuit for linear image scanning having a linear image sensor with two parallel rows of opto-electronic sensor elements is known from "IEEE Transactions On Electron Devices," Vol. ED-25, No. 2, February, 1978 at pages 125 through 131. As disclosed therein, the sensor elements in one of the rows comprise a first group which are disposed behind a color filter of a first type and the sensor elements in the other row comprise a second group which are disposed behind color filters of a second type. An array having a linear image sensor for scanning the images of a continuously moving 8 mm film, which supplies a television signal containing the information, is disclosed in BBC Report RD 1973/32 (PH-113) "Solid State Sensors: The Use of a Single Dimension 512 Element Array for Film Scanning," pages 1 through 17, published in November, 1973 by the British Broadcasting Corporation.

A problem in equipping such linear image sensors with photodiodes for use with varying colors of incident radiation is that the spectral-light sensitivity of the groups of photodiodes with the color filters results in unbalanced output signals for the different groups, that is, the sensor groups have output signals which are unmatched. The first document identified above discloses the concept of controlling the integration times of the sensor elements, however, such integration control is not undertaken for the purpose of matching or balancing the output signals to compensate for varying exposure intensities in the manner of an electronic diaphragm or iris. Such control is undertaken by a gate which covers a semiconductor zone between a series of photodiodes, which serve as the sensor elements, and which also covers storage capacitors associated with the sensor elements.

A circuit for color image scanning utilizing two rows of sensor elements with different color filters is disclosed and claimed in the co-pending application Ser. No. 75,000 (Herbst) filed July 12, 1979 based on the German application P 28 38 098.5.

Related Application

This application is related to an application of the same inventors entitled "Readout Circuit for a Monolithically Integrated Circuit for Linear Image Scanning" filed simultaneously with the present application and identified with Ser. No.171,718 filed July 24, 1980.

SUMMARY OF THE INVENTION

It is an object of the present invention to provide a monolithically integrated linear image scanning circuit which compensates or equalizes varying spectral light-sensitivities of the sensor elements employed therein.

The above object is inventively achieved in a monolithically integrated circuit having two rows of sensor elements will all sensor elements in a first row being covered with a first type of spectral filter, and elements in the second row being alternately covered with second and third types of spectral filters. The sensor elements are thus divided into three spectral groups.

The rows of sensor elements are disposed parallelly with three overflow gates disposed between the rows, one overflow gate for each sensor element group. The individual sensor elements are exposed to incident radiation for a period known as the integration time. Each overflow gate is supplied with a clock pulse voltage which can be individually selectively varied for selected dimensioning of the individual integration times for each sensor group. By appropriate time-dimensioning of the clock pulse voltages supplied to the overflow gates, the integration times for the sensor element groups can be precisely set so that variations and light-sensitivity resulting from the use of different spectral filters among the different sensor groups is compensated and balanced output signals for each sensor element group are achieved.

The row of sensor elements containing alternating sensor elements in two of the spectral groups is disposed adjacent to first and second parallel charge transfer devices. Charge packets from sensor elements in one of the two groups are transferred to the first charge transfer device for further transfer therein to an output stage, and charge packets from the other group of sensor elements in that row are transferred beneath extended electrodes in the first charge transfer device into the second charge transfer device for further transfer therein to an output stage.

The other row of sensor elements, in which all sensor elements are in the same spectral group, is disposed adjacent to a row of storage capacitors for momentarily storing charge packets from sensors in that row before transfer into a third charge transfer device disposed adjacent to the storage capacitors. The charge packets are further transferred in the third charge transfer device to an output stage.

DESCRIPTION OF THE PREFERRED EMBODIMENTS

Figure 1:
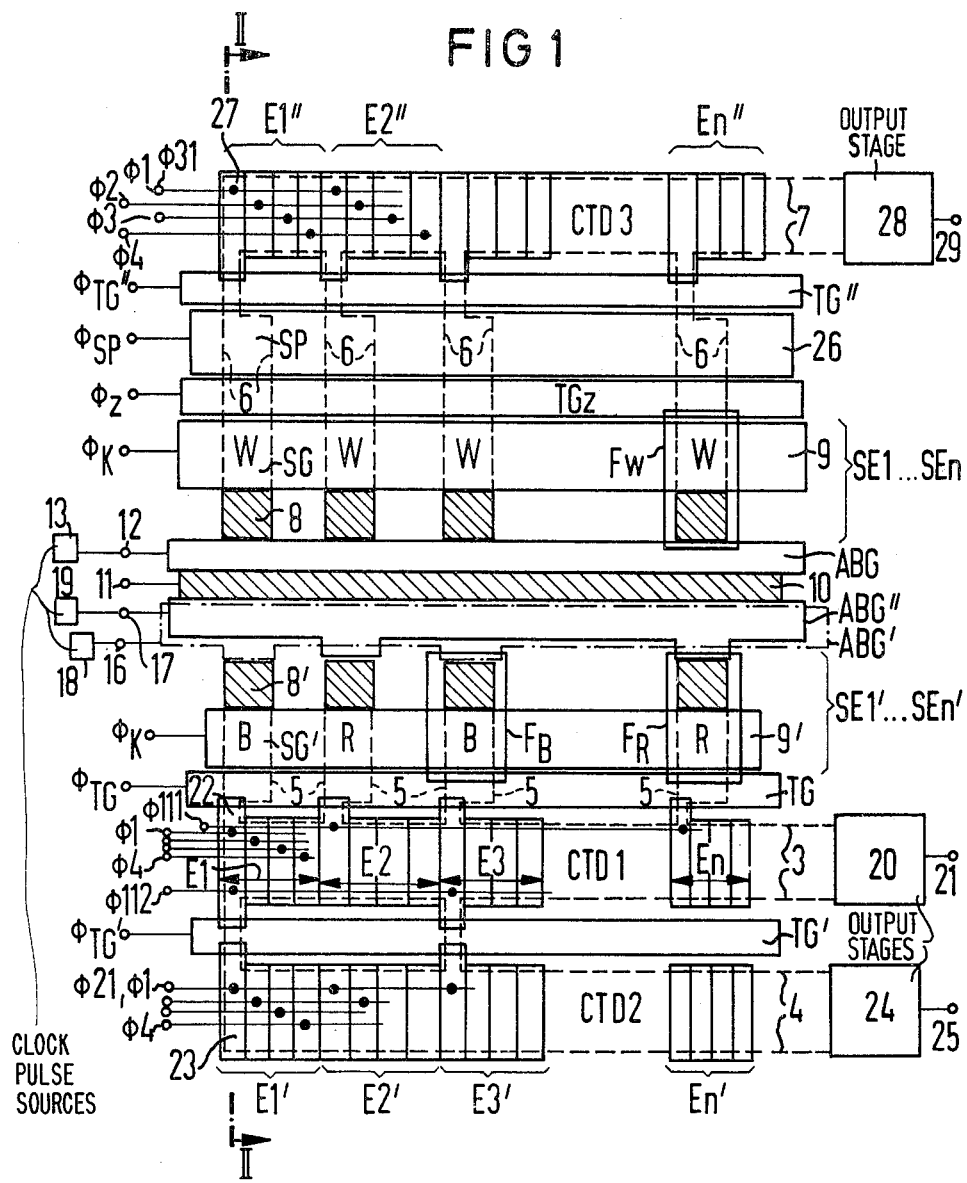
FIG. 1 is a schematic circuit diagram of a monolithically integrated circuit for linear image scanning with matchable sensors constructed in accordance with the principles of the present invention.
Figure 2:
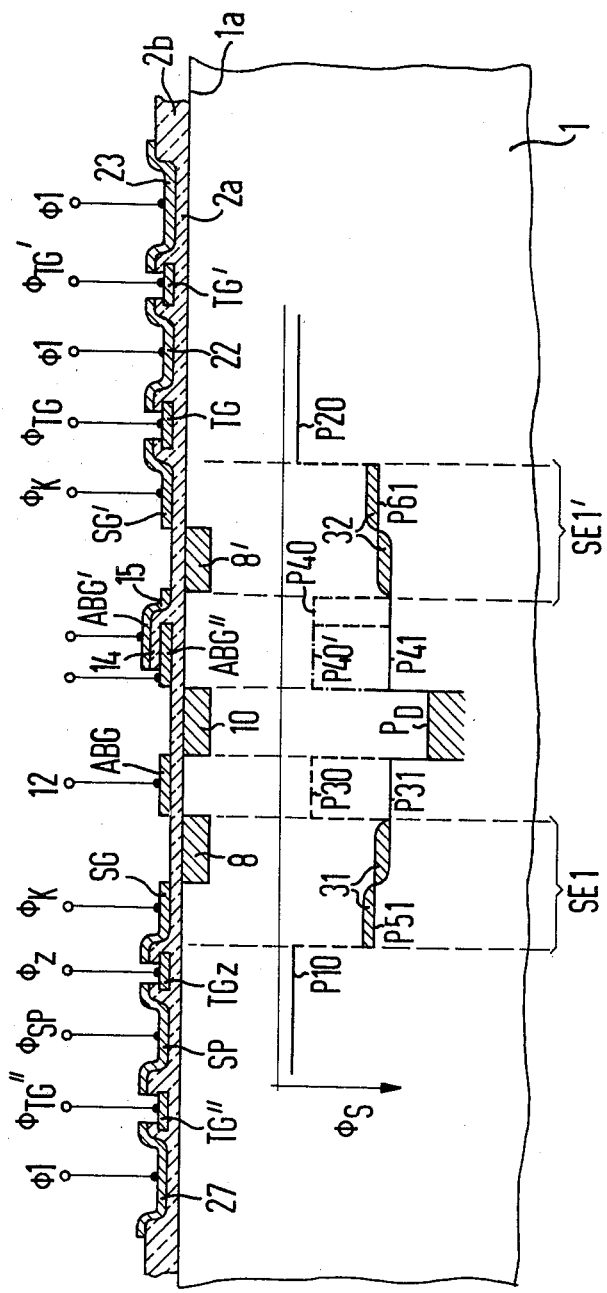
FIG. 2 is a sectional view taken along line II—II of FIG. 1 with an associated diagram of potential levels in the substrate beneath the various components thereon.

A linear image sensor is schematically shown in FIG. 1 and is shown in section in FIG. 2 which is monolithically integrated on a semiconductor substrate 1 which may consist, for example, of p-conductive silicon. The semiconductor substrate 1 has a boundary surface 1a on which an electrically insulating layer or film which may consist, for example, of silicon dioxide is disposed. The insulating layer has thin film zones 2a and thick film zones 2b. The thin film zones 2a are disposed within the dashed lines indicated at 3, 4, 5, 6 and 7 in FIG. 1 and beyond those dashed lines the thick film areas 2b exist. In the example of a silicon dioxide layer, the thin film zones are gate oxide zones, and the thick film zones are field oxide zones.

A first row of opto-electronic sensor elements is referenced in FIG. 1 at SE1 through SEn. Each such sensor element SE1 through SEn consists of a zone 8, disposed on the boundary surface 1a, which is doped oppositely to the semiconductor substrate 1, so that in the present example the zones 8 are n-conductive, and further consists of a metal-insulator semiconductor (MIS) capacitor disposed adjacent to the zones 8. Each MIS capacitor has an external electrode SG which is formed by a portion of an electrically conductive strip coating 9 disposed above the gate oxide zone bounded by the lines 6, and connected to a clock pulse voltage $\phi_K$.

A second row of opto-electronic sensor elements is also disposed on the semiconductor substrate 1 and is referenced SE1' through SEn' in FIG. 1. Each sensor element in the second row consists of an oppositely doped zone 8' disposed on the boundary surface 1a and an MIS capacitor disposed adjacent to the oppositely doped zone 8' having an external electrode SG' formed by a portion of a second electrically conductive strip coating 9' which is disposed above the gate oxide zone bounded by the lines 5. The electrically conducting strip 9' is also connected to the clock pulse voltage $\phi_K$. Beneath each of the external electrodes SG and SG' a potential well (P51 and P61 in FIG. 2) is built up during the application of the clock pulse voltage $\phi_K$. Such potential well serving as a means for storing charges which are optically generated in the adjacent zone 8 or 8' and also under the external electrode SG or SG' itself.

The sensor elements in the two rows are divided into three groups, the first of which consists of all of the sensor elements in the first row, SE1 through SEn, which are referenced with W. Alternating sensor elements in the second row SE1' through SEn' belong to the second group which are referenced with B, and the remaining alternate sensor elements in the second row belong to the third group and are referenced by R. All sensor elements of the first group W are covered with color filters of a first type, one of which is shown in FIG. 1 indicated by a frame $F_W$. The sensor elements of the second group are covered with color filters of a second type, one of which is shown in FIG. 1 referenced at $F_B$, and the sensor elements in the third group are covered by color filters of a third type, one of which is shown in FIG. 1 referenced by a frame $F_R$. The color filters of the second type $F_B$ and of the third type $F_R$ have varying spectral sensitivity curves which, for example, may correspond to the primary colors blue and red, whereas the color filters of the first type $F_W$ have sensitivity curves which substantially include the entire range of visible light and have a range of maximum sensitivity in the spectral range of the primary color green. Alternatively, the color filters $F_W$ may be limited to a sensitivity curve disposed only in the spectral range of the primary color green.

Between the two series of sensor elements is disposed an overflow drain zone 10 which is doped oppositely to the semiconductor substrate 1 and is connected to an operating voltage $U_{DD}$ by a terminal 11. A first overflow gate ABG is disposed on the insulating layer and covers the semiconductor zone between the sensor elements SE1 through SEn and the overflow drain zone 10. The first overflow gate ABG is connected by a terminal 12 with a clock pulse voltage source 13.

Between the overflow drain zone 10 and the series of sensor elements SE1' through SEn' are disposed two additional overflow gates. A second overflow gate ABG' is referenced by the dash-dot lines in FIG. 1 and is connected to a clock pulse voltage source 18, and a third overflow gate ABG" is connected through a terminal 17 to a clock pulse voltage source 19. As shown in FIG. 2, the third overflow gate ABG" is disposed directly on a thin film portion of the insulating layer, whereas the second overflow gate ABG' is disposed on a plane above the gate ABG" and is separated from ABG' by an intermediate insulating layer 14. The second and third overflow gates ABG' and ABG" have a comb-like design and are offset relative to one another to such an extent that the tooth-like projections of ABG' are connected to the sensor elements of the second group B, whereas the tooth-like projections of the third overflow gate ABG" are connected to the sensor elements of the third group R.

Adjacent to the second row of sensor elements SE1' through SEn' is a transfer gate TG which is separated from the boundary surface 1a by the insulating layer and which is connected with a clock pulse voltage $\phi_{TG}$ at a terminal. Next to the transfer gate TG are disposed the transfer electrodes of a readout charge transfer device arrangement CTD1 which operates in a four-phase mode. The charge transfer device CTD1 is comprised of a plurality of transfer stages E1, E2, E3 through En each of which is comprised of four transfer electrodes respectively connected to clock pulse voltages $\phi1$ through $\phi4$. The device CTD1 terminates in an output stage 20 having an output terminal 21 of a type known to those skilled in the art. The first transfer electrodes of each transfer stage of the device CTD1 are formed by conductive coatings which slightly overlap the marginal areas of the transfer gate TG and which are separated from the latter by an intermediate insulating layer as shown in FIG. 2.

Next to the readout device CTD1, a second charge transfer device CTD2 of similar construction is disposed having transfer stages referenced at E1' through En'. A second transfer gate TG' connected at a terminal with a clock pulse voltage $\phi_{TG'}$ is disposed between the devices CTD1 and CTD2. One transfer electrode, such as electrode 22 in CTD1 and electrode 23 in CTD2, extend over the marginal areas of the second transfer gate TG' and are separated therefrom by an intermediate insulating layer. The second charge transfer device CTD2 has a transfer channel indicated between the dashed lines 4 which leads to an output stage 24 having a terminal 25 of the type known to those skilled in the art.

Those transfer stages such as E1 of CTD1 associated with the second group B additionally have a clock pulse voltage $\phi112$ connected thereto, while those transfer stages, such as E2 which are associated with the third group R are connected to a clock pulse voltage $\phi111$. In the second charge transfer device CTD2, the extended transfer electrode, such as 23 in each transfer stage is connected to a clock pulse voltage $\phi21$.

A third transfer gate TGz is disposed adjacent to the electrically conducting strip 9 and is connected to a clock pulse voltage $\phi_z$. Next to the gate TGz is disposed an electrically conducting strip coating 26 which extends above the thin film areas referenced by the dashed lines 6 to form a series of storage capacitors SP for the sensor elements SE1 through SEn. The strip 26 is connected to a clock pulse voltage $\phi_{SP}$ at a terminal.

Disposed on the opposite side of the strip 26 is a fourth transfer gate TG" which is connected at a terminal to a clock pulse voltage $\phi_{TG''}$.

A third readout charge transfer device CTD3 is disposed next to the fourth transfer gate TG" which has a transfer channel within the dashed lines 7 covered by transfer electrodes arranged in transfer stages E1", E2" through En" and leads to an output stage 28 of the type known to those skilled in the art having an output terminal 29. Each transfer stage, such as E1" in the device CTD3 consists of four transfer electrodes respectively connected to clock pulse voltages $\phi 1$, $\phi 2$, $\phi 3$ and $\phi 4$. In addition, one electrode, such as transfer electrode 27 in each transfer stage extends above a marginal area of the fourth transfer gate TG" and is additionally connected to a clock pulse voltage $\phi 31$. An intermediate insulation layer is disposed above the extended electrodes and the transfer gate TG".

Figure 3:
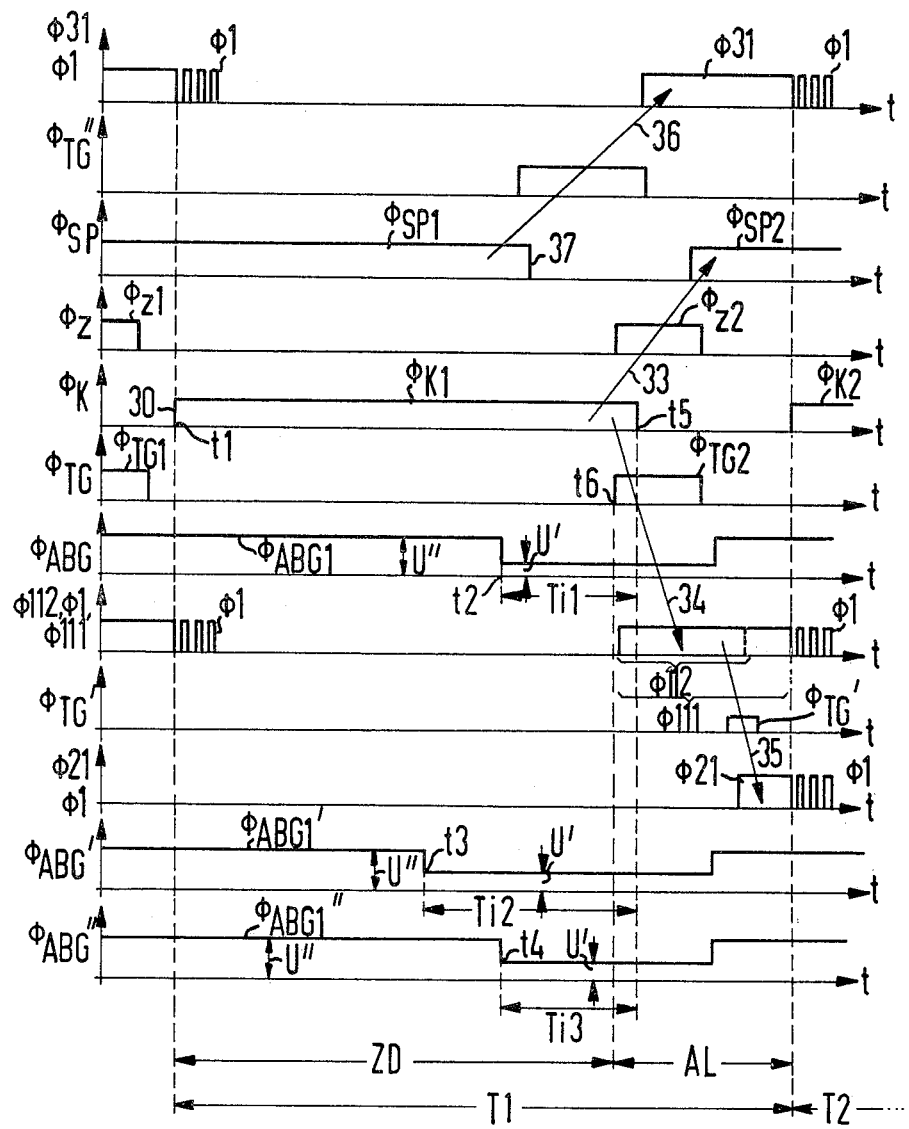
FIG. 3 is a voltage/time diagram for the various clock pulse voltages for operating the circuits shown in FIGS. 1 and 2.

Operation of an integration cycle T1 will be undertaken with reference to the voltage/time diagram of FIG. 3 and the boundary surface potential profile $\phi_S$ shown in FIG. 2 with the solid lines. Upon the occurrence of the trailing edges of the clock pulses $\phi_{z1}$ and $\phi_{TG1}$, the sensor elements SE1' and SE1 have been separated by the respective potential thresholds P10 and P20 respectively from the memory capacitor SP and from the extended transfer electrode 22 of CTD1. This occurs prior to time t1 which begins the integration cycle T1.

Clock pulses $\phi_{ABG1}$, $\phi_{ABG1'}$ and $\phi_{ABG1''}$, each beginning before time t1 with the amplitude U" generate potential values P31 and P41 beneath the overflow gates ABG, ABG' and ABG" at time t1, which potential values P31 and P41 are greater than the potential values P51 and P61 of the zones of the sensor elements SE1 and SE1' which are disposed beneath the external electrodes SG and SG'. Charge packets 31 and 32, respectively, optically generated in SE1 and SE1', thus flow off or drain into the overflow zone 10 having a potential value $P_D$ as a result of the operating voltage connected thereto.

At a time t2 the value of $\phi_{ABG1}$ changes from U" to a smaller value U' which results in the formation of a potential barrier P30 and designates the beginning of an integration time Ti1 for the sensor element SE1 as well as all other sensor elements in the group W. The form integration time designates the time span in which optically generated charges are collected in the various sensor elements, whereby the quantity of the collected charges is dependent upon the exposure intensities and hence upon the incident local image data.

At a time t3, the clock pulse $\phi_{ABG1'}$ changes magnitude to the value U' resulting in a potential threshold P40 which designates the beginning of the integration time Ti2 for SE1' and all other sensors in the group B. At a time t4, the clock pulse voltage $\phi_{ABG1''}$ changes value generating a potential threshold $\phi 40'$ for the sensor elements in the group R which begins the integration time Ti3 for those sensor elements. The potential threshold P40' is also in front of the sensor elements for the group B but effects no change in the operating state for those sensor elements because the potential threshold P40 is already present at an equal value. The integration times for all groups of sensor elements terminate upon the occurrence of the trailing edge of a pulse $\phi_{K1}$ of the clock pulse voltage $\phi_K$ at a time t5. The pulse $\phi_{K1}$ has a leading edge 30 which begins at the time t1.

At a time t6, which precedes the time t5, the leading edges of pulses $\phi_{TG2}$ and $\phi_{z2}$ occur, and also preceding time t5 the leading edges of pulses $\phi 112$ and $\phi 111$ occur. Upon the termination of the pulse $\phi_{K1}$ at the time t5, a transfer of the charge generated by the sensors in the group W is effected beneath the gate TGz into the memory capacitors SP which are supplied with a pulse $\phi_{SP2}$. This transfer is indicated by the arrow 33 in FIG. 3.

A simultaneous transfer of the charges generated in the sensors in the groups B and R occurs beneath the gate TG into the first charge transfer device CTD1. A pulse $\phi_{TG}$, supplied to the gate TG' effects the further transfer of only those charge packets from the sensors in group B into the second charge transfer device CTD2. Thus, only charge packets associated with the group R remain in the first device CTD1. The transfer of charge packets from the groups B and R into the device CTD1 is referenced by the arrow 34 in FIG. 3 and the further transfer of the charge packets associated with the group B is indicated by the arrow 35 and a further enabled by the pulse $\phi 21$ appearing at the extended electrodes of CTD2 such as transfer electrode 23.

At this time, the outputs of the clock pulse generators 13, 18 and 19 are switched back to the voltage value U'" as a consequence of which the potential thresholds P30, P40 and P40' die out so that after the termination of the pulses $\phi_{TG2}$ and $\phi_{z2}$ and at the appearance of the leading edge of $\phi_{K2}$, at the commencement of a new integration cycle T2, the potential state at the time t1 described above is again present in the substrate 1.

Before the charge packet transfer indicated by the arrow 33 into the storage capacitors SP, those storage capacitors have been emptied of the charge stored therein from the preceding integration cycle as indicated by the arrow 36. This occurs by the appearance of a pulse $\phi_{TG''}$ having a duration overlapping the trailing edge 37 of a pulse $\phi_{SP1}$ and the leading edge of the pulse $\phi 31$. This effects transfer of the charge from the storage capacitors SP from the preceding integration cycle into the device CTD3 via the extended electrodes such as transfer electrode 27. The charge packets are then respectively transferred in the charge transfer devices CTD1, CTD2 and CTD3 in a manner known in the art by the successive application of the clock pulse voltages $\phi 1$ through $\phi 4$. The signals then respectively occur at the output electrodes 21, 25 and 29.

During the integration cycle preceding T1, a specific image line of a color image to be scanned was oriented with respect to the row of sensor elements SE1 through SEn provided with filters Fw from which sensor signals were derived and intermediately stored in the storage capacitors SP. During the integration cycle T1 illustrated in FIG. 3, as a consequence of the continuous movement of the color image to be scanned the same line is then aligned or oriented to the row of sensor elements SE1' through SEn' whereby from the second row sensor signals from the elements covered by the frames $F_B$ and $F_R$ were derived and read out into the devices CTD1 and CTD2. Simultaneously the intermediately stored packets from the group W were also read out from the storage capacitors SP into the device CTD3. At the commencement of the integration cycle T2, the connected clock pulse voltages $\phi 1$ through $\phi 4$ thus supply corresponding signals from the three groups W, R and B to the respective output stages. From the voltage signals occurring at the outputs 21, 25 and 29, so-called color value signals can be derived in a manner known in the art which control the intensities or luminosities of the primary colors of a color picture tube.

The pulse length of the pulses $\phi_{ABG1}$, $\phi_{ABG1'}$, and $\phi_{ABG1''}$ can be selectively dimensioned so that the integration times Ti1, Ti2 and Ti3 are thereby also individually and independently adjustable. This allow compensation and balancing of the varying sensitivity of the respective sensor elements to light of different wave lengths. It may be preferable, for example, in the manner indicated in FIG. 3 to select the integration time Ti2 of the sensor elements belonging to the group B as greater than the integration time Ti3 of the sensor elements in the group R because the sensor elements are less sensitive to blue light than to red light. It will be understood that identical photoiodes are utilized for each sensor element in the areas 8 and 8', with the only difference being the presence of the filter frames $F_W$, $F_B$ and $F_R$ over the elements in each group.

It will be understood to those skilled in the art that the MIS capacitors referenced at SG and SG' of the sensor elements may be eliminated so that the sensor elements consist solely of the photodiodes in the areas designated 8 and 8'. In this embodiment, the integration cycle begins and ends with the simultaneously occurring trailing edges of the clock pulses $\phi_{TG}$ and $\phi_z$.

In the embodiment discussed herein having a p-conductive substrate 1 the indicated potentials and voltages exhibit positive polarities as compared with the reference potential at which the semiconductor substrate 1 lies. If conductivity types of the opposite type are utilized, than the polarity of the voltages and potentials will be reversed.

The charge transfer device arrangements discussed above are of the type known as surface charge coupled devices (SCCD) however the inventive concept disclosed herein may also be practiced with charge transfer device arrangements of any type known to those skilled in the art such as those described in the text by Sequin and Tompsett identified above. Such charge transfer device arrangements may function in two-, three-, four- or multi-phase operation.

The portion of the integration cycle T1 designated in FIG. 3 at ZD represents the line duration. This is the time span in which the sensor signals corresponding to an image line, under the influence of the clock pulse voltages $\phi 1$ through $\phi 4$, are emitted at the outputs 21, 25 and 29. This duration may be selected to correspond with the time span during which an electron beam, controlled by the further-processed sensor signals, of an image display device requires in order to right an image line. Within a line duration ZD the line signal, obtained in the directly preceding integration cycle, is read out from the inventive circuit. The period AL, disposed between two periods ZD is known as the blanking interval. During this time, an electron beam recording the line signal in a reproduction device is blanked out and conveyed from the preceding line end to the beginning of the next line. In the case of reproduction in a standard television apparatus, the periods ZD and AL have the respective values of 52 $\mu$s and 12 $\mu$s.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a circuit for linear image scanning monolithically integrated on a semiconductor substrate havig first and second parallel rows of opto-electronic sensor elements with sensor elements in said first and second rows being respectively disposed behind one of a plurality of groups of color filters, each group of color filters having a different spectral range, the improvement of:

an overflow drain zone disposed at a boundary surface of said semiconductor substrate between said first and second rows of sensor elements and having a conductivity opposite to said semiconductor substrate and connected to a constant operating potential;

a plurality of overflow gates disposed between said overflow drain zone and sensor elements disposed behind each group of color filters, each of said overflow gates being connected to respective clock pulse voltage sources each alternating between a lower voltage value which generates a potential barrier in said substrate beneath a respective overflow gate for preventing transfer of charge from a sensor element into said overflow drain zone, and an upper voltage value for allowing transfer of said charge from a sensor element into said overflow drain zone, whereby the respective duty times of the pulses from said clock pulse voltage sources are selected for compensating and balancing variations in sensitivity to said different spectral ranges of said sensor elements.

2. The improvement of claim 1 wherein one of said groups of color filters has a spectral range corresponding to the primary color blue and another of said group of color filters has a spectral range corresponding to the primary color red and wherein said duty cycle for said clock pulse voltage connected to said overflow gate between said overflow drain zone and sensor elements disposed behind said red filters is greater than the duty time of the clock pulse voltage connected to the overflow gate disposed between said overflow drain zone and said sensor elements disposed behind said blue color filters.

3. The improvement of claim 2 wherein said blue color filters and said red color filters alternately cover sensor elements in said second row of sensor elements and wherein two overlapping overflow gates separated by an insulation layer for respectively transferring charge from sensor elements behind said blue and red filters into said overflow drain zone are disposed between said second row of sensor elements and said overflow drain zone, each said overflow gate comprised of a strip having a plurality of teeth extending therefrom in the direction of said second row, with said teeth for said overlapping overflow gates being offset such that teeth from one overflow gate are disposed between sensors disposed behind said red filters and said overflow drain zone and teeth from the other of said overlapping overflow gates are disposed between sensors disposed behind said blue filters and said overflow drain zone.

4. The improvement of claim 1 wherein said sensor elements consist of photodiodes.

5. The improvement of claim 1 wherein each of said sensor elements consists of a metal-insulator-semiconductor capacitor and a photodiode disposed adjacent to each other.

6. A method for compensating for differing sensitivities of sensor elements disposed behind different color filters to the spectral ranges associated with said color filters wherein said sensor elements are disposed on a semiconductor substrate adjacent to a plurality of overflow gates, said overflow gates in turn disposed adjacent to an overflow drain region in said semiconductor substrate comprising the steps of:

allocating one of said plurality of overflow gates to each group of sensor elements covered by a different color filter;

supplying a clock pulse voltage to each of said overflow gates which alternates between a low voltage value preventing transfer of charge from said sensor elements into said overflow drain region and a high voltage value permitting transfer of charge from said sensor elements into said overflow drain region; and selectively varying the duty times of said clock pulse voltages for varying the period during which charge is permitted to transfer from sensor elements disposed behind each color filter and said overflow drain region, said selective varying of said duty times corresponding to the sensitivity of said sensor elements to the colors of said color filters.

* * * * *